United States Patent [19]

Nishiguchi et al.

[11] Patent Number: 4,705,697
[45] Date of Patent: Nov. 10, 1987

[54] ELECTRON BEAM FORMATION OF A THERMAL HEAD USING TITANIUM SILICIDE

[75] Inventors: Yasuo Nishiguchi; Keijirou Minami; Masakazu Hoda, all of Kokubu, Japan

[73] Assignee: Kyocera Corporation, Kyoto, Japan

[21] Appl. No.: 878,416

[22] Filed: Jun. 25, 1986

Related U.S. Application Data

[62] Division of Ser. No. 765,851, Aug. 14, 1985.

[30] Foreign Application Priority Data

Aug. 17, 1984 [JP] Japan .................................. 59-172304

[51] Int. Cl.[4] ........................... B05D 3/06; B05D 5/12
[52] U.S. Cl. ......................................... 427/36; 427/42; 427/58; 427/123; 427/124; 427/126.1; 427/126.3
[58] Field of Search ....................... 427/35, 36, 42, 58, 427/126.3, 123, 124, 126.1

[56] References Cited

U.S. PATENT DOCUMENTS 4,180,596 12/1979 Crowder et al. ..................... 427/42
4,364,969 12/1982 Dearnaley et al. ................... 427/38
4,379,832 4/1983 Dalal et al. ....................... 427/36 X

*Primary Examiner*—Thurman K. Page

*Attorney, Agent, or Firm*—Spensley Horn Jubas & Lubitz

[57] ABSTRACT

Disclosed is a thermal head for thermal recording, which comprises as the heat-generating resistor a dense thin layer having a composition represented by the following formula:

$$Ti_xSi_yO_z$$

wherein
x is a number of from 0.25 to 0.45, y is a number of from 0.25 to 0.40 and z is a number of from 0.25 to 0.40, with the proviso that the sum of x, y and z is equal to 1.

This heat-generating resistor has a large specific resistance and generates a large quantity of heat per unit electric current, and in this heat-generating resistor, deviation of the temperature is small and the heat-generating resistor is tightly boned to an electric conductor. Therefore, the printing operation can be performed stably for a long period.

This heat-generating resistor is formed by depositing a thin film on a substrate by subjecting titanium silicide or a combination of silicon and titanium to sputtering or electron beam deposition in a reduced-pressure atmosphere containing oxygen.

1 Claim, 3 Drawing Figures

ELECTRON BEAM FORMATION OF A THERMAL HEAD USING TITANIUM SILICIDE

This is a division of application Ser. No. 06/765,851, filed on Aug. 14, 1985.

BACKGROUND OF THE INVENTION (1) Field of the Invention

The present invention relates to a thermal head for thermal recording and a method for the fabrication thereof. More particularly, the invention relates to an improved heat-generating resistor for a thermal head, which has a high specific resistance and hence, generates a large quantity of heat per unit electric current and which is excellent in the uniformity of generation of heat and also in the bondability to an electric conductor. Furthermore, the present invention relates to a method for forming a heat-generating resistor on a substrate by sputtering or electron beam vacuum deposition.

(2) Description of the Prior Art

A conventional thermal head for thermal recording has a laminate structure obtained, for example, by laminating a heat-generating resistor composed of tantalum nitride ($Ta_2N$), an electric conductor composed of a metal such as aluminum (Al), gold (Au) or copper (Cu) and a protecting film composed of tantalum pentoxide ($Ta_2O_5$) or the like in order on a substrate composed of an electrically insulating material such as alumina. By applying a certain electric power to the heat-generating resistor through the electric conductor, Joule heat generation is caused in the heat-generating resistor and the function of the thermal head is exerted.

In this conventional thermal head, however, since the specific resistance of tantalum nitride constituting the heat-generating resistor is relatively small, for example 260 $\mu\Omega$-cm, and in order to produce a desired temperature in the heat-generating resistor in a moment (within 0.5 to 2 milliseconds), a large electric current should be caused to flow in the heat-generating resistor, and a power source for supplying a large electric current is necessary. Furthermore, in case of a thermal head having a plurality of electric conductors connected to a common conductor, because of the power loss by resistances of the electric conductors and common conductor, there is brought about a difference of the quantity of the electric current flowing in the heat-generating resistor between the case where generation of heat is simultaneously caused in many heat-generating resistors and the case where generation of heat is effected in a small number of heat-generating resistors, and this difference of the quantity of the electric current results in deviation of the printing density.

Moreover, in this conventional thermal head, since tantalum nitride constituting the heat-generating resistor has poor affinity with aluminum, gold or copper constituting the electric conductor, the bonding strength between the heat-generating resistor and the electric conductor is extremely low and if an external force is applied at the time of the operation of the thermal head, for example, the electric conductor is readily peeled from the heat-generating resistor and it becomes impossible to apply a predetermined voltage. Accordingly, it is impossible to elevate the temperature of the heat-generating resistor to a desired level by Joule heat generation, with the result that the thermal head fails to duly function or printing cannot be satisfactorily performed.

SUMMARY OF THE INVENTION

It is therefore a primary object of the present invention to provide a thermal head for thermal recording, which has a layer of a heat-generating resistor having a relatively high specific resistance and being capable of forming a strong bonding to an electric conductor because of a good affinity with aluminum, gold or copper constituting the electric conductor.

Another object of the present invention is to provide a thermal head in which heat generation is always effected at a predetermined temperature, uneven printing can be eliminated and which can perform thermal recording stably for a long period.

Still another object of the present invention is to provide a thermal head in which the amount of heat generated by the heat-generating resistor is larger than in the conventional thermal head and deviation of generation of heat can be reduced, and a method for the fabrication of this thermal head.

A further object of the present invention is to provide a method for the fabrication of a thermal head in which the thickness of a heat-generating resistor can be made uniform and the composition of the heat-generating resistor can be kept constant uniformly.

In accordance with one fundamental aspect of the present invention, there is provided a thermal head for thermal recording, which comprises a heat-generating resistor formed on a substrate and an electric conductor for supplying electric power to the heat-generating resistor, wherein the heat-generating resistor is composed of a dense thin layer having a composition represented by the following formula:

$$Ti_xSi_yO_z$$

wherein
x is a number of from 0.25 to 0.45, y is a number of from 0.25 to 0.40 and z is a number of from 0.25 to 0.40, with the proviso that the sum of x, y and z is equal to 1.

In accordance with another fundamental aspect of the present invention, there is provided a method for fabricating a thermal head by forming a layer of a heat-generating resistor on a substrate and forming a layer of an electric conductor on the layer of the heat-generating layer, which comprises placing the substrate and an evaporation source composed of titanium silicide or a combination of silicon and titanium into a vacuum vessel provided with an electron beam-generating device, maintaining said vacuum vessel in an atmosphere containing oxygen and an inert gas under a pressure of from $10^{-4}$ to $10^{-6}$ mmHg, and applying electron beams to said evaporation source to evaporate silicon and titanium, whereby a thin layer of a compound having a composition represented by the following formula:

$$Ti_xSi_yO_z$$

wherein
x is a number of from 0.25 to 0.45, y is a number of from 0.25 to 0.40 and z is a number of from 0.25 to 0.40, with the proviso that the sum of x, y and z is equal to 1,
is formed on the substrate.

Furthermore, in accordance with the present invention, there is provided a method for fabricating a thermal head by forming a layer of a heat-generating resistor on a substrate and forming a layer of an electric conductor on the layer of the heat-generating resistor, which comprises placing the substrate and an evaporation source composed of titanium silicide or a combination of silicon and titanium in a vacuum vessel having a negative electrode and a positive electrode so that the evaporation source is attached to the negative electrode and the substrate is attached to the positive electrode, maintaining said vessel in an atmosphere containing oxygen and an inert gas under a pressure of from $10^{-2}$ to $10^{-3}$ mmHg, and applying a high-frequency electric power to the negative and positive electrodes to evaporate silicon and titanium, whereby a thin layer of a compound having a composition represented by the following formula:

$$Ti_xSi_yO_z$$

wherein
x is a number of from 0.25 to 0.45, y is a number of from 0.25 to 0.40 and z is a number of from 0.25 to 0.40, with the proviso that the sum of x, y and z is equal to 1,
is formed on the substrate.

DETAILED DESCRIPTION OF THE PREFERRED EMBODIMENTS

Figure 1:
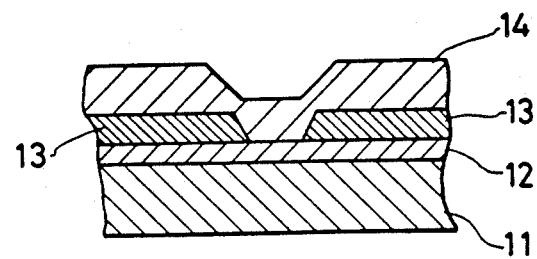
FIG. 1 is a sectional view illustrating a main part of one embodiment of a thermal head according to the present invention.

FIG. 1 illustrates one embodiment of the thermal head according to the present invention. Reference numeral 11 represents a substrate composed of an electrically insulating material such as alumina. A heat-generating resistor 12 is attached onto the substrate 11 and an electric conductor 13 is disposed on the heat-generating resistor 12.

A protecting film 14 having excellent abrasion resistance, which is composed of tantalum pentoxide ($Ta_2O_5$) or the like, is formed on the heat-generating resistor 12 and electric conductor 13 so as to prevent wearing of the heat-generating resistor 12 and electric conductor 13 by contact with a heat-sensitive paper and also prevent the heat-generating resistor 12 from contact with air.

One of the important features of the present invention resides is that a dense thin layer having a composition represented by the above-mentioned formula is used as the heat-generating resistor. In this composition or compound, that the Ti component acts as a component imparting an electric conductivity to the heat-generating resistor and the Si and O (oxygen) components act as components increasing the specific resistance of the heat-generating resistor. It is critical for attaining the objects of the present invention that the three components of titanium, silicon and oxygen should be present at the above-mentioned three-component atomic ratio.

More specifically, if the amount of the titanium component is smaller than 25 atomic % or larger than 45 atomic % based on the three components, the heat-resisting resistor becomes thermally unstable. If the amount of the silicon component is smaller than 25 atomic % or larger than 40 atomic % based on the three components, the heat-generating resistor becomes thermally unstable. By the term "thermally unstable" as used herein, it is meant that the electric resistance of the heat-generating resistor becomes unstable at high temperatures and the heat-generating resistor does not show a certain electric resistance. If the amount of the oxygen component is smaller than 25 atomic % based on the three components, the specific resistance of the thin layer is reduced and it becomes difficult to attain the objects of the present invention. On the other hand, if the amount of the oxygen component is larger than 40 atomic % based on the three components, the specific resistance of the thin layer becomes too high and the thin layer becomes thermally unstable.

The heat-generating resistor layer of the present invention is composed of a compound in which the atomic ratio of Ti, Si and O is within the above-mentioned certain range. Another important feature of the present invention is that this compound is present in the form of a dense thin layer. This dense thin layer can be formed by the high-frequency sputtering method or electro beam vacuum deposition method described in detail hereinafter. The heat-generating resistor layer of the present invention has a specific resistance of 300 to 5000 $\mu\Omega$-cm, expecially 500 to 1500 $\mu\Omega$-cm. Since this specific resistance is higher than the specific resistance of the conventional heat-generating resistor, in the heat-generating resistor of the present invention it is possible to increase the quantity of heat generated at a constant electric current and eliminate deviation of the quantity of generated heat.

The heat-generating resistor used in the present invention is a dense thin layer composed of an amorphous compound having the above-mentioned chemical composition. This thin layer is thermally stable and the resistance value is constant without any deviation. Of course, the specific resistance of the heat-generating resistor layer can be optionally controlled within the above-mentioned range by adjusting the above-mentioned atomic composition of the three components.

It is generally preferred that the thickness of the heat-generating resistor 12 be in the range of 200 to 1000 Å (angstroms).

Since the heat-generating resistor 12 has a predetermined electric resistance, if a certain voltage is applied to the resistor 12, Joule heat generation is caused and the temperature is elevated to a level necessary for printing, for example, 300° to 450° C.

The electric conductor 13 formed on the heat-generating resistor 12 is composed of aluminum (Al), gold (Au), copper (Cu) or the like, and a voltage for causing Joule heat generation in the heat-generating resistor 12 is applied to the electric condutor 13.

$Ti_xSi_yO_z$ (in which x, y and z are as defined above), employed as the material of the heat-generating resistor 12, has a good affinity or compatibility with aluminum, gold, copper or the like, the material of the electric conductor 13, and even if an external force is applied to the heat-generating resistor 12 and electric conductor 13, during the operation of the thermal head, for example, the electric conductor 13 is not peeled from the heat-generating resistor 12.

The heat-generating resistor 12 is formed by the sputtering method or electron beam vacuum deposition method described hereinafter, and the electric conductor 13 and protecting film 14 are formed by the known vacuum deposition method or sputtering method.

The method for forming the heat-generating resistor in the thermal head of the present invention will now be described in detail.

Figure 2:
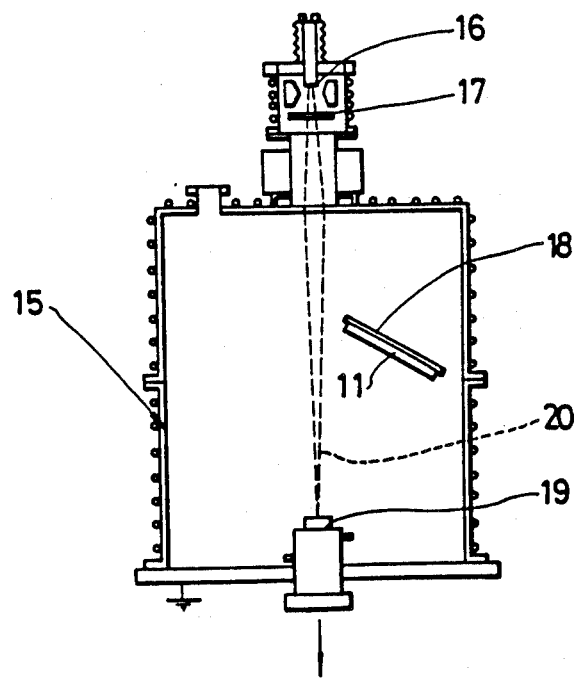
FIG. 2.is an arrangement diagram illustrating an electron beam vacuum deposition device for use in forming a layer of a heat-generating resistor.

The heat-generating resistor film 12 in the thermal head of the present invention is formed by the electron beam vacuum deposition method using, for example, an electron beam vacuum deposition device illustrated in FIG. 2. This electron beam vacuum deposition device has a structure in which an electron beam generating device comprising a negative electrode 16 and a positive electrode 17, a substrate holder 18 and an evaporation source 19 are arranged in a vacuum vessel 15.

For formation of the heat-generating resistor film 12 by this electron beam vacuum deposition device, the substrate 11 is attached to the substrate holder 18 and titanium silicide (TiSi) is arranged in the evaporation source 19. As the source of the titanium silicide, there may be used, for example, a tablet formed by press-molding a powder of titanium silicide under a pressure of at least 100 kg/cm$^2$.

Then, the vacuum vessel 15 is sealed and evacuated by means of a vacuum pump to form in the vacuum vessel an atmosphere containing oxygen, optionally together with an inert gas (Ar), under a pressure of from $10^{-4}$ to $10^{-6}$ mmHg. In the case where the above-mentioned atmosphere is formed by the evacuation operation, there may be adopted a method in which the evacuation operation is carried out until the degree of vacuum becomes higher than the above-mentioned level and then, oxygen and argon are supplied at an optional molar ratio to form an atmosphere having the above-mentioned pressure. It is preferred that the partial pressure of oxygen in this atmosphere be in the range of from $10^{-5}$ to $10^{-7}$ mmHg.

A high voltage, for example, a voltage of 5 to 20 KV, is applied between the negative electrode 16 and positive electrode 17 to emit electron beams 20. The titanium silicide evaporation source 19 is irradiated with the electron beams 20 to evaporate titanium silicide in the space within the vessel 15. The evaporated silicon nitride is deposited on the substrate 11 in the state coupled with oxygen left in the vessel 15, whereby the heat-generating resistor film 12 is formed on the substrate 11.

The amount of oxygen contained in the heat-generating resistor film 12 can be controlled by the concentration of oxygen left in the electron beam vacuum deposition device, the temperature and the evaporation deposition speed. The speed of the evaporation deposition of the heat-generating resistor film 12 is ordinarily from scores of angstroms to several hundred angstroms per minute.

Figure 3:
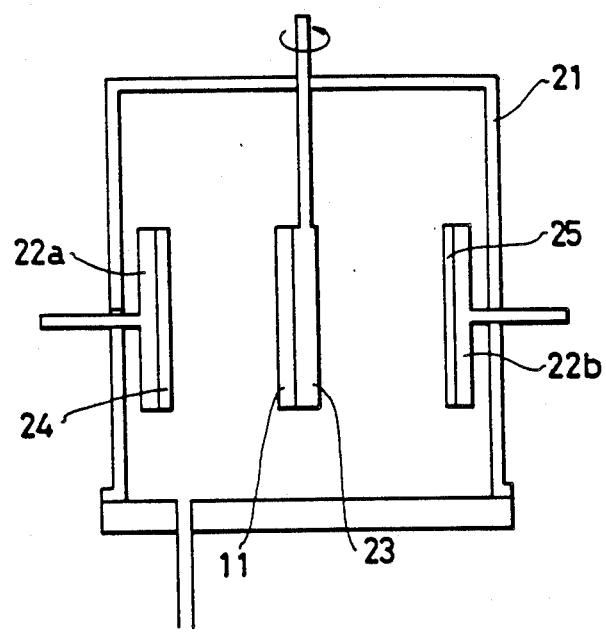
FIG. 3 is an arrangement diagram illustrating a high-frequency sputtering device for use in forming a layer of a heat-generating resistor.

Furthermore, the heat-generating resistor film 12 in the thermal head of the present invention can be formed by the high-frequency sputtering method using, for example, a high-frequency sputtering device shown in FIG. 3. This high-frequency sputtering device has a structure in which two negative electrodes 22a and 22b and a positive electrode 23 are arranged in a vacuum vessel 21.

For formation of the heat-generating resistor film 12 by this high-frequency sputtering device, targets 24 and 25 composed of silicon and titanium, respectively, are attached to the two negative electrodes 22a and 22b, and an insulating substrate 11 is attached to the positive electrode 23. The vacuum vessel 21 is evacuated to increase the vacuum degree, and an argon gas or an argon gas containing $O_2$ is filled in the vessel 21 so that the inner pressure is $10^{-3}$ to $10^{-2}$ mmHg. A high-frequency electric power (for example, 5 MHz, 3 KW) is applied between the negative electrodes 22a and 22b and the positive electrode 23 to emit an argon ion and an oxygen ion. These ions are caused to impinge against targets 24 and 25 and parts of the targets 24 and 25 are scattered, whereby the above-mentioned compound is formed and the surface of the insulating substrate 11 is covered with this compound to form the heat-generating resistor film 12 on the insulating substrate. Incidentally, it is preferred that the partial pressure of oxygen be in the range of from $10^{-4}$ to $10^{-3}$ mmHg.

In the case where the heat-generating resistor is formed on the surface of the substrate according to the above-mentioned sputtering method or electron beam vacuum deposition method, if the temperature of the substrate is elevated to 200° to 500° C. by heating, the adhesion of the heat-generating resistor to the substrate can be improved. Therefore, it is preferred that the substrate be heated to 200° to 500° C.

According to the method of the present invention, the above-mentioned titanium silicide suboxide is formed in the form of a very dense film having a uniform thickness. This is one of the advantages attained by the present invention.

For example, in the above-mentioned sputtering method, if the speed of formation of the heat-generating resistor film is adjusted to 100 Å/min and the pressure of the atmosphere is adjusted to $10^{-3}$ mmHg, a dense film of a heat-generating resistor having a composition of $Ti_{0.35}Si_{0.32}O_{0.33}$ and a specific resistance of 600μΩ-cm, which is uniform in the thickness, can be formed.

We claim:

1. A method for fabricating a thermal head by forming a layer of a heat-generating resistor on a substrate and forming a layer of an electric conductor on the layer of the heat-generating layer, which comprises placing the substrate and an evaporation source composed of titanium silicide or a combination of silicon and titanium into a vacuum vessel provided with an electron beam-generating device, maintaining said vacuum vessel in an atmosphere containing oxygen and an inert gas under a pressure of from $10^{-4}$ to $10^{-6}$ mmHg, and applying electron beams to said evaporation source to evaporate silicon and titanium, whereby a thin layer of a compound having a composition represented by the following formula:

$$Ti_xSi_yO_z$$

wherein
  x is a number of from 0.25 to 0.45, y is a number of from 0.25 to 0.40 and z is a number of from 0.25 to 0.40, with the proviso that the sum of x, y and z is equal to 1,
is formed on the substrate.

* * * * *